United States Patent [19]

Holman et al.

[11] Patent Number: 5,308,993
[45] Date of Patent: May 3, 1994

[54] SEMICONDUCTOR WAFER CASSETTE MAPPER HAVING DUAL VERTICAL COLUMN OF LIGHT EMITTING APERTURES AND A SINGLE VERTICAL COLUMN OF LIGHT RECEIVING APERTURES

[75] Inventors: George T. Holman; Ronald E. Logan, both of Louisville, Colo.

[73] Assignee: Avalon Engineering, Inc., Boulder, Colo.

[21] Appl. No.: 36,178

[22] Filed: Mar. 28, 1993

[51] Int. Cl.$^5$ .............................................. G01V 9/04
[52] U.S. Cl. ................................. 250/561; 250/223 R; 414/936
[58] Field of Search ............... 250/561, 221, 548, 557, 250/223 R; 414/936, 937, 938, 331, 416, 417; 356/400, 401

[56] References Cited

U.S. PATENT DOCUMENTS 4,803,373  2/1989  Imamura et al. .................... 250/561
5,225,691  7/1993  Powers et al. ........................ 250/561

Primary Examiner—David C. Nelms
Assistant Examiner—Que T. Le
Attorney, Agent, or Firm—William E. Hein

[57] ABSTRACT

A wafer cassette mapper detects the presence or absence of a wafer in a particular corresponding pair of slots in a wafer cassette, as well as a cross slotted condition in which a wafer is not aligned in a corresponding pair of slots. The wafer cassette mapper includes a base member for receiving a standard slotted wafer cassette, the base member supporting a transmitter/receiver module adjacent the rear of the wafer cassette. The transmitter/receiver module includes two vertical columns of light emitting apertures, coupled to an infrared transmitter array, and a single vertical column, between the two columns of light emitting apertures, of light receiving apertures coupled to an infrared receiver array. Corresponding light emitting apertures in each of the two columns are positioned to illuminate the rear edge of each of the wafers in the wafer cassette at an angle that will cause the diffused reflected light to enter an associated one of the light receiving apertures. Alternate ones of the light emitting apertures are positioned to illuminate the vertical space between each of the wafer slots of the cassette, and a corresponding alternate one of the light receiving apertures detects light reflected by a cross slotted wafer that is positioned in this otherwise unoccupied space. Control circuitry selectively interrogates the infrared receiver array during a period of time in which the infrared transmitter array is turned on in order to determine if a particular light receiving aperture has received light reflected by a particular wafer. Logic circuitry then processes this information for each wafer slot of the wafer cassette to determine if a wafer is present, absent or cross slotted.

5 Claims, 4 Drawing Sheets

SEMICONDUCTOR WAFER CASSETTE MAPPER HAVING DUAL VERTICAL COLUMN OF LIGHT EMITTING APERTURES AND A SINGLE VERTICAL COLUMN OF LIGHT RECEIVING APERTURES

REFERENCE TO RELATED APPLICATION

This application is related to commonly owned allowed U.S. patent application Ser. No. 07/885,116 filed May 18, 1992, now U.S. Pat. No. 5,225,691, the subject matter of which is incorporated herein by reference.

BACKGROUND AND SUMMARY OF THE INVENTION

This invention relates generally to manufacturing processes in the hard disk, compact disk, liquid crystal display, solar cell, and semiconductor fabrication industries. Manufacturing processes for a wide variety of products utilize thin circular or square wafer media fabricated from metal, plastic, silicon or other materials. These and other applications require the use of cassettes to hold the wafers in exact positions, referred to as wafer planes. Several types of wafer cassettes are used to hold these wafers, depending on the particular process being performed. For example, teflon cassettes are typically employed to hold the wafers while they are in chemical processes; ABS plastic traveller cassettes are employed to transport wafers from one process to the next; and quartz cassettes are employed to retain wafers during high temperature processes. These manufacturing processes occur in carefully controlled clean rooms that must not be contaminated by the manufacturer's processes.

The largest of the above-mentioned industries in which semiconductor wafer cassettes are employed is the semiconductor processing industry. Standard wafer cassettes are employed to hold twenty-five standard silicon or gallium arsenide wafers of a certain diameter. The semiconductor industry uses these thin, very fragile silicon wafers that are typically 4, 5, 6 or 8 inches in diameter on which to fabricate integrated circuits. More than $100,000 worth of packaged integrated circuits may be fabricated on a single one of these wafers. It is therefore extremely important to prevent damage to the fragile wafers on which as many as 300 separate manufacturing processes may be performed before the wafer is cut into separate dies for final packaging. The processing equipment required to manufacture integrated circuits is very expensive, so any increase in manufacturing speed and yield is highly desirable.

In order to increase manufacturing speed and reliability, loading and unloading robots are used to transfer the wafers from one cassette to another. However, wafers are sometimes loaded into incoming cassettes by hand, typically from manual inspection stages. Manual loading of cassettes presents the opportunity for creating a disastrous condition known as cross slotting. This condition occurs when a wafer is not loaded into corresponding slots on each side of the cassette, resulting in one side of a loaded wafer being higher than the other side, rather than the wafer being in a perfectly horizontal position. When a cross slotted wafer is presented to the pickup arm of a robot, the arm jams the fragile wafer, thereby not only shattering that wafer but also contaminating the otherwise good wafers in the cassette and clean room with pieces of the shattered wafer that may be only microscopic in size.

An additional problem is presented in prior art cassette handling systems when a cassette coming into a robot stage is only partially filled with wafers. The robot assumes that every slot of a cassette contains a wafer and is therefore designed to traverse each of the twenty-five slot positions of the cassette in its attempts to pick a wafer from each slot position. In the case of wafer cassettes that are not completely filled, valuable time is wasted as the robot searches unfilled wafer positions.

Several attempts have been made in the prior art to provide wafer detection systems. One such prior art system is based on non-inductive proximity detection, since silicon, aluminum or plastic wafers are not ferromagnetic. In this type of system, an electrostatic field effect sensor is mounted on the robot arm to detect the presence or absence of a wafer in each slot position of a cassette. These wafer detection systems suffer from long traverse times and, more importantly, make no provision for detecting cross slotted wafers.

Another known wafer detection system employs a small video camera which is remotely mounted on the robot's arm. A video framegrabber and image analysis software are integrated with the robot controller. The images obtained by the remote head video camera are used to detect the presence or absence of a wafer in each slot position of a cassette. These video camera systems are expensive and, like the proximity detectors described above, have limited capability for detecting cross slotted wafers.

Yet another known wafer detection system is that described in the allowed U.S. patent application referenced above. This system involves separate transmitter and receiver modules mounted on opposite sides of a wafer cassette for transmitting and receiving light across the full width of the wafer cassette in order to detect the presence or absence of a wafer in a particular pair of slots of the wafer cassette and to also detect a cross slotted condition. The use of separate transmitter and receiver modules in this prior art system requires the use of interconnection cables between the two modules, thereby increasing the cost of the system. Since the separate transmitter and receiver modules must be positioned in close proximity to the wafer cassette that is inserted between them, the system must be tailored for use with wafer cassettes of different sizes.

It is therefore a principal object of the present invention to provide a wafer cassette mapper that may be used with wafer cassettes of different size and in which a single light transmitter/receiver module is employed to provide information indicating the presence or absence of a wafer in each slot of the wafer cassette, as well as information indicating a cross slotted condition.

This and other objects are accomplished in accordance with the illustrated preferred embodiment of the present invention by providing a base member for receiving a standard slotted wafer cassette, the base member supporting a transmitter/receiver module positioned adjacent the rear of the cassette. The transmitter/receiver module contains two vertical columns of light emitting apertures, coupled to an infrared transmitter array, and a single vertical column, positioned between the two columns of light emitting apertures, of light receiving apertures coupled to an infrared receiver array. The infrared transmitting array may be direct or diffused, modulated or on/off keyed. Corresponding light emitting apertures in each of the two columns are positioned to illuminate the rear edge of each of the wafers in the wafer cassette at an angle that will cause the diffused reflected light to enter an associated one of the light receiving apertures. Alternate ones of the light emitting apertures are positioned to illuminate the vertical space between each of the wafer slots of the cassette, and a corresponding alternate one of the light receiving apertures detects light reflected by a cross slotted wafer that is positioned in this otherwise unoccupied space. The infrared transmitter array is powered on for a predetemined period of time, while the infrared receiver array is interrogated during that period of time to determine which of the particular light receiving apertures are receiving light reflected by the wafers in the cassette. This information is then processed for each wafer slot of the cassette to determine if a wafer is present, absent or cross slotted.

Several wafer cassette mappers may be connected in a system configuration to serve a semiconductor fabrication process. In such a system configuration, an external host computer is employed to interrogate the various wafer cassette mappers. The user may thereby request cassette map information from selected ones of the wafer cassette mappers and use, store, transmit or make a hard copy of the requested cassette map information.

DETAILED DESCRIPTION OF THE INVENTION

Figure 1:
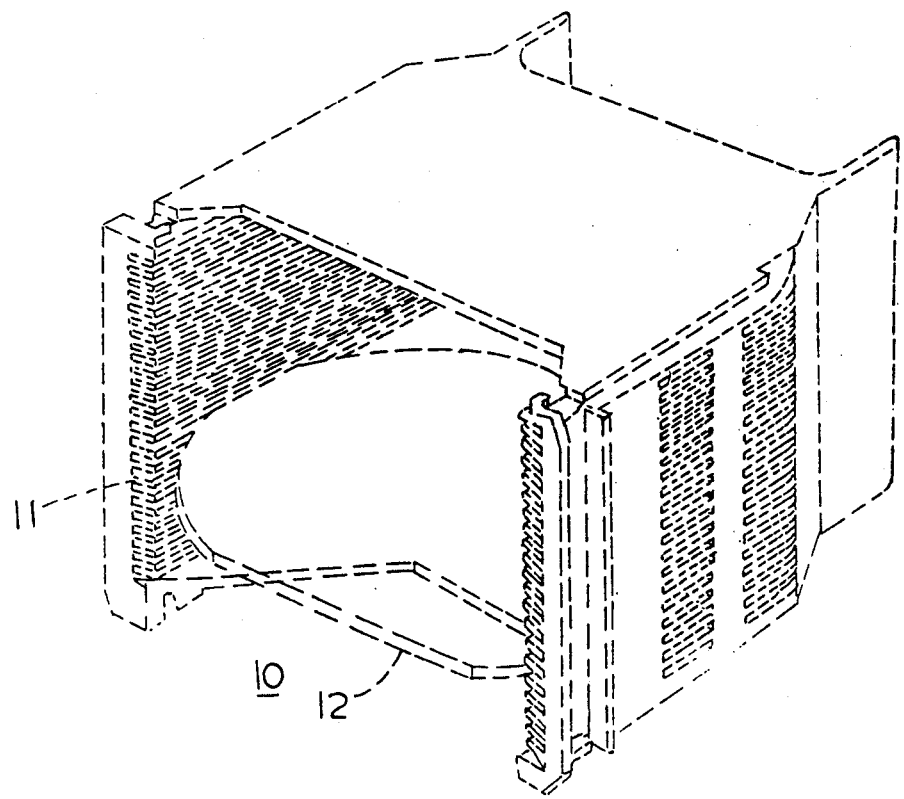
FIG. 1 is a pictorial diagram of a representative industry standard wafer cassette that may be employed with the wafer cassette mapper of the present invention.
Figure 2:
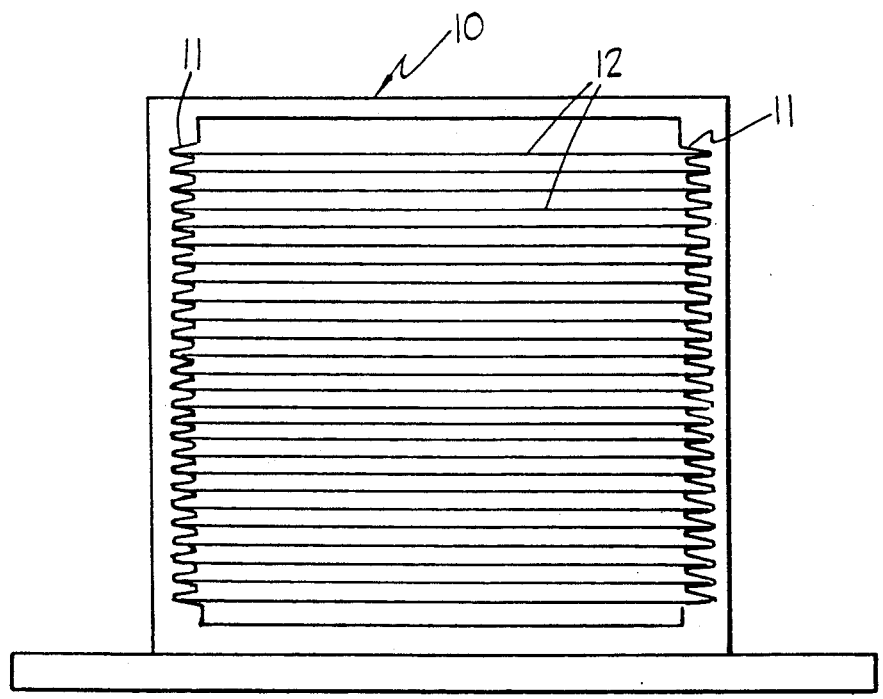
FIG. 2 is a front view of the wafer cassette of FIG. 1 with twenty-five standard wafers positioned therein.
Figure 3:
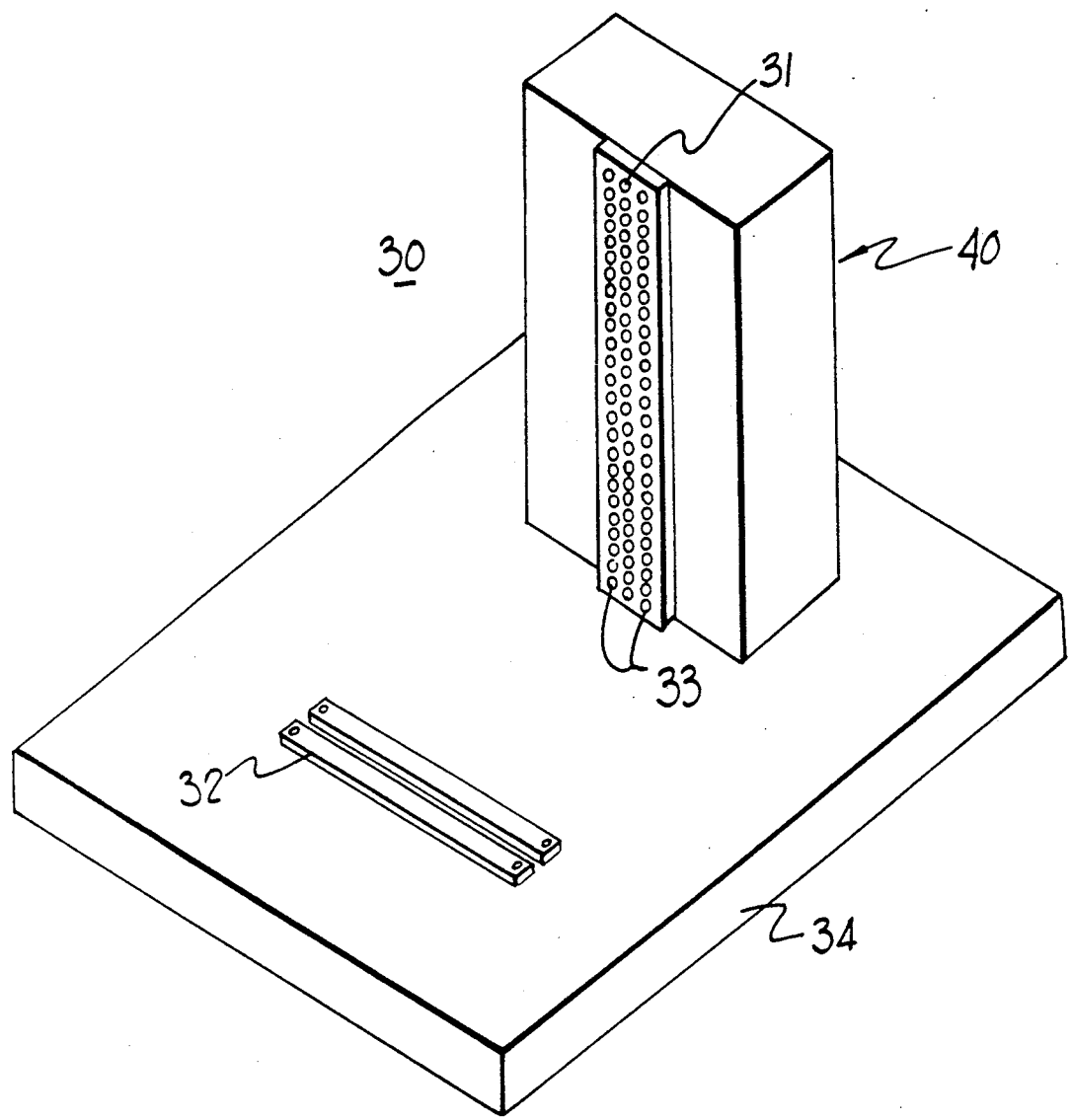
FIG. 3 is a pictorial diagram of the wafer cassette mapper of the present invention that receives a standard wafer cassette like the one illustrated in FIG. 1.

Referring now to FIGS. 1 and 2, there is shown an industry standard wafer cassette 10 capable of holding a full complement of twenty-five wafers 12. Each of the wafers 12 is positioned horizontally within wafer cassette 10 in corresponding evenly-spaced slots 11 located along each side of wafer cassette 10. A wafer cassette mapper 30, illustrated pictorially in FIG. 3, is adapted to receive wafer cassette 10 with wafers 12 loaded therein. Wafer cassette mapper 30 comprises a base member 34 that supports a transmitter/receiver module 40 fixedly positioned near a rear end thereof. A pair of alignment bars 32 fixedly positioned on base member 34 serve to precisely locate wafer cassette 10 when it is positioned in front of transmitter/receiver module 40. Wafer cassette 10 is arranged for downward engagement with wafer cassette mapper 30 and for upward disengagement therefrom. When wafer cassette 10 is so engaged, alignment bars 32 mate with conventional mounting features on the underside of wafer cassette 10.

Transmitter/receiver module 40 houses a plurality of light emitting aperture pairs 33 arranged in two columns on the forward face of transmitter/receiver module 40. A corresponding plurality of light receiving apertures 31 are arranged in a single column between the two columns of light emitting aperture pairs 33. Alternate ones of the light emitting aperture pairs 33 and a corresponding alternate one of the light receiving apertures 31 are positioned at a height that corresponds to the height of a corresponding one of the twenty-five wafers positioned in wafer cassette 10 when it is engaged with wafer cassette mapper 30. Similarly, alternate ones of the light emitting aperture pairs 33 and a corresponding alternate one of the light receiving apertures 31 are positioned at a height that corresponds to the height of the vertical space between each of the twenty-five wafers 12 positioned in wafer cassette 10 when it is engaged with wafer cassette mapper 30.

Figure 4:
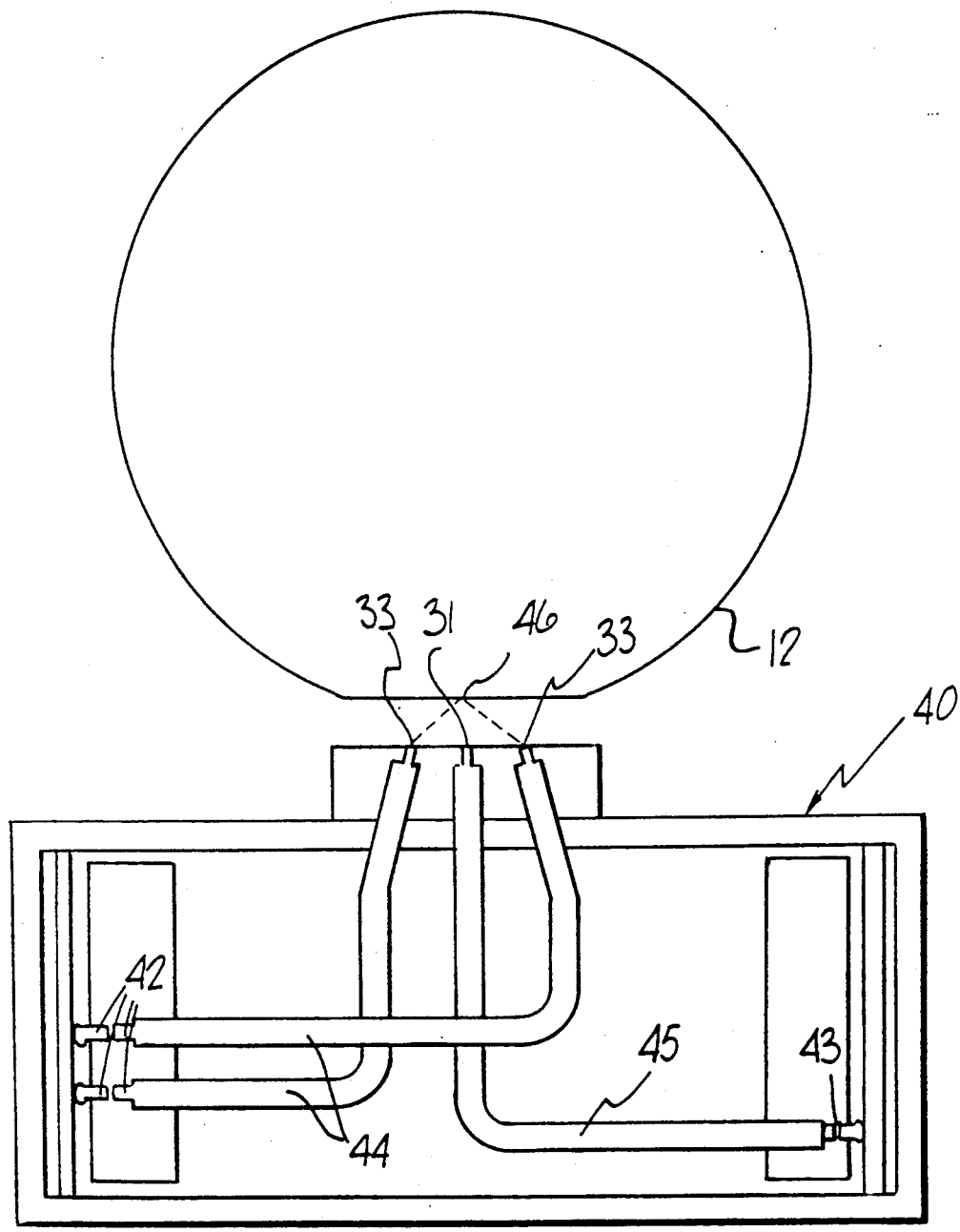
FIG. 4 is a cross-sectional top view along the horizontal plane of a representative wafer positioned within the wafer cassette of FIGS. 1 and 2, illustrating the spatial relationship between a wafer positioned within the wafer cassette and the wafer cassette mapper of FIG. 3.

Reference is now also made to FIG. 4, which illustrates a top cross-sectional view of a representative one of wafers 12 in relationship to transmitter/receiver module 40 when wafer cassette 10 is engaged with wafer cassette mapper 30. Light is emitted from alternate ones of the light emitting aperture pairs 33 at an angle such that light beams emitted therefrom will intersect at a focal point 46 on the rear edge of the corresponding one of wafers 12. The presence of the corresponding one of wafers 12 at focal point 46 causes diffused reflected light to enter corresponding receiver aperture 31. In a similar manner, each alternate pair of light transmitting apertures 33 and the corresponding alternate one of light receiving apertures 31 that are positioned at the height of the vertical space between adjacent ones of the wafers 12 in wafer cassette 10 are employed to detect a cross slotted condition in which a wafer is not positioned in a corresponding pair of slots 11 on each side of wafer cassette 10, but rather is positioned such that the wafer partially occupies the space between a corresponding pair of slots 11. A pair of transmitter light pipes 44 may be employed to convey light from a corresponding pair of light transmitters 42 within transmitter/receiver module 40 to a corresponding pair of light emitting apertures 33 on the front face thereof, and a receiver light pipe 45 may be similarly employed to convey light received from each of light receiving apertures 31 on the front face of transmitter/receiver module 40 to a corresponding light receiver 43 within transmitter/receiver module 40.

Transmitter/receiver module 40 is preferably fabricated of a material such as black polycarbonate to eliminate internally reflected fugitive light emitted from light transmitters 42 or from coupling blocks coupling light pipes 44 thereto from being erroneously detected by the light receivers 43. Additionally, transmitter/receiver module 40 is preferably machined to have a smooth outer surface to thereby minimize the attraction of ariborne particles in order to maintain a clean room environment.

Figure 5:
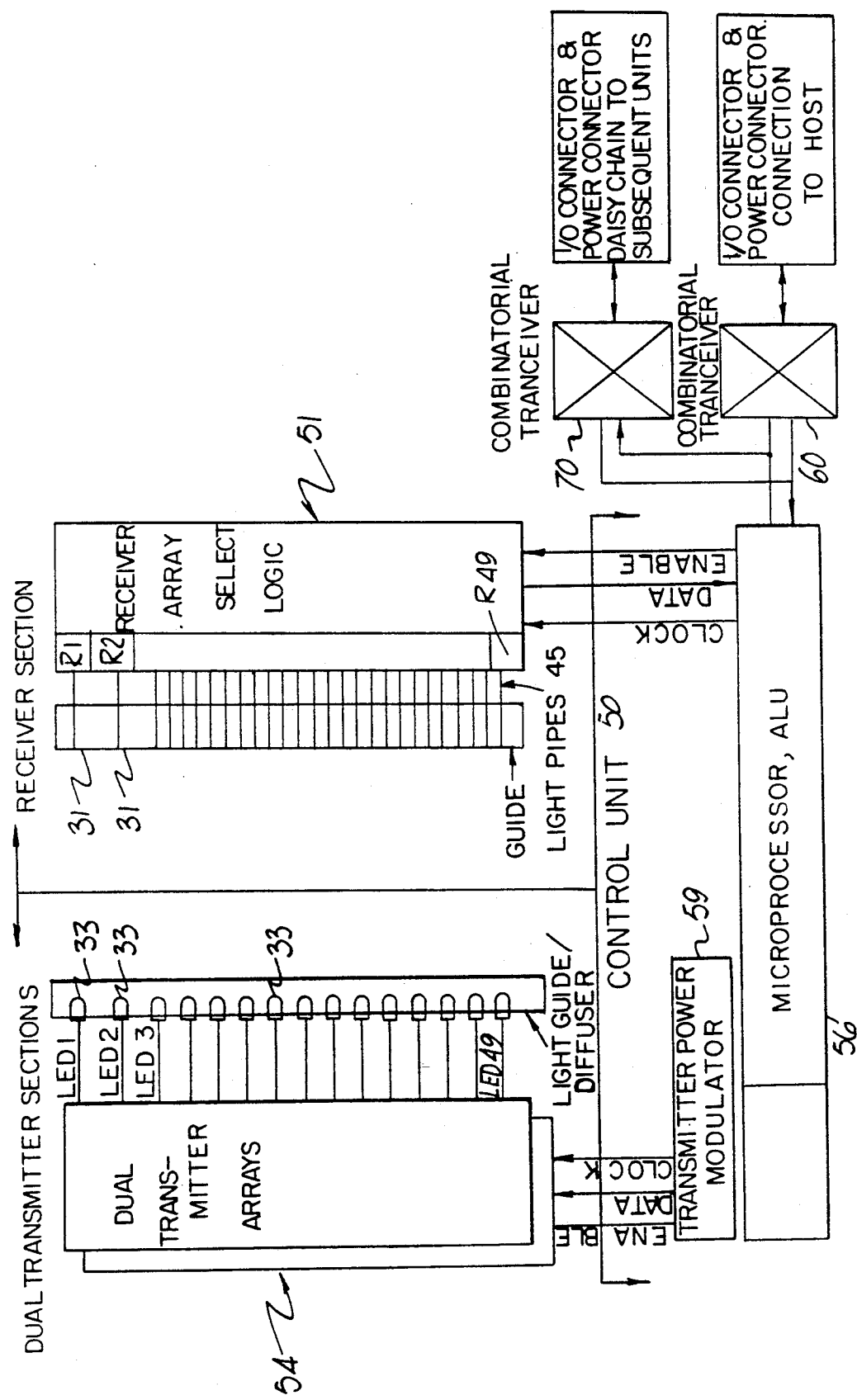
FIG. 5 is a block diagram of the electronic circuitry employed in the wafer cassette mapper of FIGS. 3 and 4.

Referring now to FIG. 5, there is shown a block diagram of circuitry employed in wafer cassette mapper 30. A dual transmitter array block 54 containing forty-nine pairs of the light transmitters 42 of FIG. 4 provides sources of light to each of the forty-nine pairs of light emitting apertures 33 on the front face of transmitter/receiver module 40, twenty-five of which are aligned with corresponding ones of the twenty-five wafers 12 contained with wafer cassette 10, and twenty-four of which are aligned with corresponding ones of the vertical spaces between each of the twenty-five wafers 12. Each of the pairs of light transmitters 42 may be turned on and off under control of a microprocessor 56. The power to each pair of light transmitters 42 may be modulated by a transmitter power modulator 59 to increase the power levels thereof or to increase the signal to noise ratio of the system. A receiver array block 51 contains forty-nine of the light receivers 43 of FIG. 4, each one of which corresponds to one of the forty-nine pairs of the light transmitters 42, for detecting light reflected from corresponding ones of properly slotted or cross slotted wafers 12 onto corresponding ones of the light receiving apertures 31. Receiver array block 51 is also controlled by microprocessor 56, and converts reflected light information into digital signals that are compatible with the logic employed in microprocessor 56. The electrical current powering receiver array block 51 may be switchable to reduce overall power consumption when receiver array bloack 51 is not in use. A control unit 50, including transmitter power modulator 59 and microprocessor 56, operates to turn on each of the forty-nine pairs of light transmitters 42 in sequence and to read the state of a corresponding one of the light receivers 43 during the time that the corresponding pair of light transmitters is turned on. In this manner, the twenty-five pairs of light transmitters 42 and twenty-five corresponding light receivers 43 facilitate monitoring of the industry standard wafer cassette 10 capable of holding twenty-five wafers 12 for the presence or absence of a wafer 12 in each of the twenty-five wafer slots 11. As stated above, an additional twenty-four pairs of light transmitters 42 and twenty-four corresponding light receivers 43 facilitate detection of a cross slotted wafer 12 in wafer cassette 10. A program that may be readily encoded by a person having ordinary skill in the art is executed by microprocessor 56 to compute a map containing information representing the presence or absence of a wafer 12 in each of the twenty-five slots 11 in wafer cassette 10, as well as information indicative of a cross slotted condition. Microprocessor 56 provides means for transmitting and receiving data from an external host computer via a combinatorial logic block 60 and for also transmitting and receiving data from additional ones of wafer cassette mapper 30 that may be connected in a daisy chain configuration via a combinatorial transceiver logic block 70. This arrangement allows the external host computer to control a number of the wafer cassette mappers 30 of the present invention such as may be employed in a manufacturing process.

We claim:

1. A wafer cassette mapper for detecting the presence or absence of a planar wafer in each of a plurality of corresponding pairs of slots along opposite sides of a wafer cassette, the wafer cassette mapper comprising:
   a base member for supporting a wafer cassette having a plurality of corresponding evenly-spaced slots located along opposite sides of the wafer cassette, each of the corresponding evenly-spaced slots being adapted to receive and retain a single planar wafer, the base member including cassette engagement means for receiving said wafer cassette;
   a transmitter/receiver module mounted on said base member adjacent a rear edge of said wafer cassette, said transmitter/receiver module including two vertical columns of light emitting apertures, horizontally aligned as pairs of light emitting apertures, and a light transmitter array coupled thereto, said transmitter/receiver module further including a single vertical column of light receiving apertures, positioned between said two vertical columns of light emitting apertures, and a light receiver array coupled thereto, each of the light receiving apertures being horizontally aligned with an associated pair of said light emitting apertures, each pair of light emitting apertures and the associated light receiving aperture being aligned with the plane of an associated wafer when positioned in its corresponding slots, each pair of light emitting apertures being positioned at an angle to each other such that beams of light emitted therefrom intersect at a focal point on a rear edge of the associated wafer; and
   control means, coupled to said light transmitter array and said light receiver array, for selectively activating said light transmitter array for a predetermined period of time and for selectively interrogating said light receiver array during that period of time to obtain status information therefrom, said control means including logic means responsive to the status information obtained from said light receiver array for determining the presence or absence of a wafer in each of the plurality of corresponding pairs of slots of said wafer cassette.

2. A wafer cassette mapper as in claim 1 further comprising:
   additional light emitting apertures within said two vertical columns of light emitting apertures, horizontally aligned as pairs of additional light emitting apertures, and an additional light transmitter array coupled thereto; and
   additional light receiving apertures within said single vertical column of light receiving apertures and an additional light receiver array coupled thereto, each of the additional light receiving apertures being horizontally aligned with an associated pair of said additional light emitting apertures;
   each of the pairs of additional light emitting apertures and the associated additional light receiving aperture being aligned with an associated space between two adjacent wafers when positioned in their corresponding slots;
   each pair of additional light emitting apertures being positioned at an angle to each other such that beams of light emitted therefrom intersect at a focal point on a rear edge of an associated cross slotted wafer; and
   said logic means being responsive to status information obtained from said additional light receiver array for determining the existence of a cross slotted condition in which a particular semiconductor wafer is not aligned in a corresponding pair of slots of the wafer cassette.

3. A wafer cassette mapper as in claim 2 wherein said control means is operative for generating cassette map information representative of the presence or absence of a wafer in each of the corresponding pairs of slots of said wafer cassette and information representative of the existence of each cross slotted condition that has been determined.

4. A wafer cassette mapper as in claim 3, further comprising: host computer means for enabling a user to enter a request for said cassette map information and for generating a visual image of said cassette map information; and
   combinatorial transceiver means, coupled to said control means and to said host computer, for communicating a user request for said cassette map information to said control means and for communicating the requested cassette map information from said control means to said host computer.

5. A wafer cassette mapper system comprising a plurality of wafer cassette mappers as in claim 3, further comprising:

host computer means for enabling a user to enter requests for cassette map information from a selected one or more of said plurality of wafer cassette mappers and for generating visual images of the requested cassette map information; and combinatorial transceiver means, coupled to each of the plurality of wafer cassette mappers and to said host computer means, for communicating a user request for cassette map information to a selected one or more of said plurality of wafer cassette mappers and for communicating the requested cassette map information to said host computer means.

* * * * *